(12) United States Patent
Meltzer et al.

(10) Patent No.: US 7,268,645 B2
(45) Date of Patent: Sep. 11, 2007

(54) INTEGRATED RESONATOR STRUCTURE AND METHODS FOR ITS MANUFACTURE AND USE

(75) Inventors: David Meltzer, Wappinger Falls, NY (US); Michael Hargrove, Clinton Corners, NY (US)

(73) Assignee: Seiko Epson Corporation, Tokyo (JP)

( * ) Notice: Subject to any disclaimer, the term of this patent is extended or adjusted under 35 U.S.C. 154(b) by 88 days.

(21) Appl. No.: 11/125,378

(22) Filed: May 9, 2005

(65) Prior Publication Data
US 2006/0250198 A1    Nov. 9, 2006

(51) Int. Cl.
*H03H 7/00* (2006.01)
*H03H 7/01* (2006.01)
(52) U.S. Cl. ............................ 333/175; 333/185
(58) Field of Classification Search ............ 333/175, 333/185
See application file for complete search history.

(56) References Cited

U.S. PATENT DOCUMENTS

| | | | |
|---|---|---|---|
| 4,573,101 A | 2/1986 | Takeno | |
| 5,032,810 A | 7/1991 | Kaneko et al. | |
| 5,492,856 A | 2/1996 | Ikeda et al. | |
| 5,915,188 A | 6/1999 | Ramakrishnan et al. | |
| 5,985,414 A * | 11/1999 | Fukuda et al. | 428/192 |
| 6,146,958 A | 11/2000 | Zhao et al. | |
| 6,222,427 B1 | 4/2001 | Kato et al. | |
| 6,380,608 B1 | 4/2002 | Bentley | |
| 6,396,458 B1 | 5/2002 | Cockson et al. | |
| 6,538,531 B2 | 3/2003 | Nosaka et al. | |
| 6,587,020 B2 | 7/2003 | Tojyo | |
| 6,970,057 B2 * | 11/2005 | Lin et al. | 333/177 |
| 6,998,938 B2 * | 2/2006 | Lin et al. | 333/177 |
| 2003/0142459 A1 | 7/2003 | Laws | |

* cited by examiner

*Primary Examiner*—Robert Pascal
*Assistant Examiner*—Kimberly E Glenn

(57) ABSTRACT

An improved integrated LC resonator and methods for making and using the same are disclosed. The resonator includes (i) a first capacitor plate; (ii) an inductor over and in electrical communication with the first capacitor plate; and (iii) a second capacitor plate over and in electrical communication with the inductor. The method of making includes sequentially forming a first capacitor plate, a first dielectric layer thereon, a first via and an inductor, a second dielectric layer on the inductor, and a second via and a second capacitor plate. Each of the capacitor plates and the inductor are generally formed in different integrated circuit layers (for example, different metallization layers). Embodiments of the present invention can advantageously provide an integrated LC resonator tank having: (i) relatively high Q by reducing or minimizing parasitic effects; and (ii) relatively high shielding from the semiconductor substrate.

24 Claims, 8 Drawing Sheets

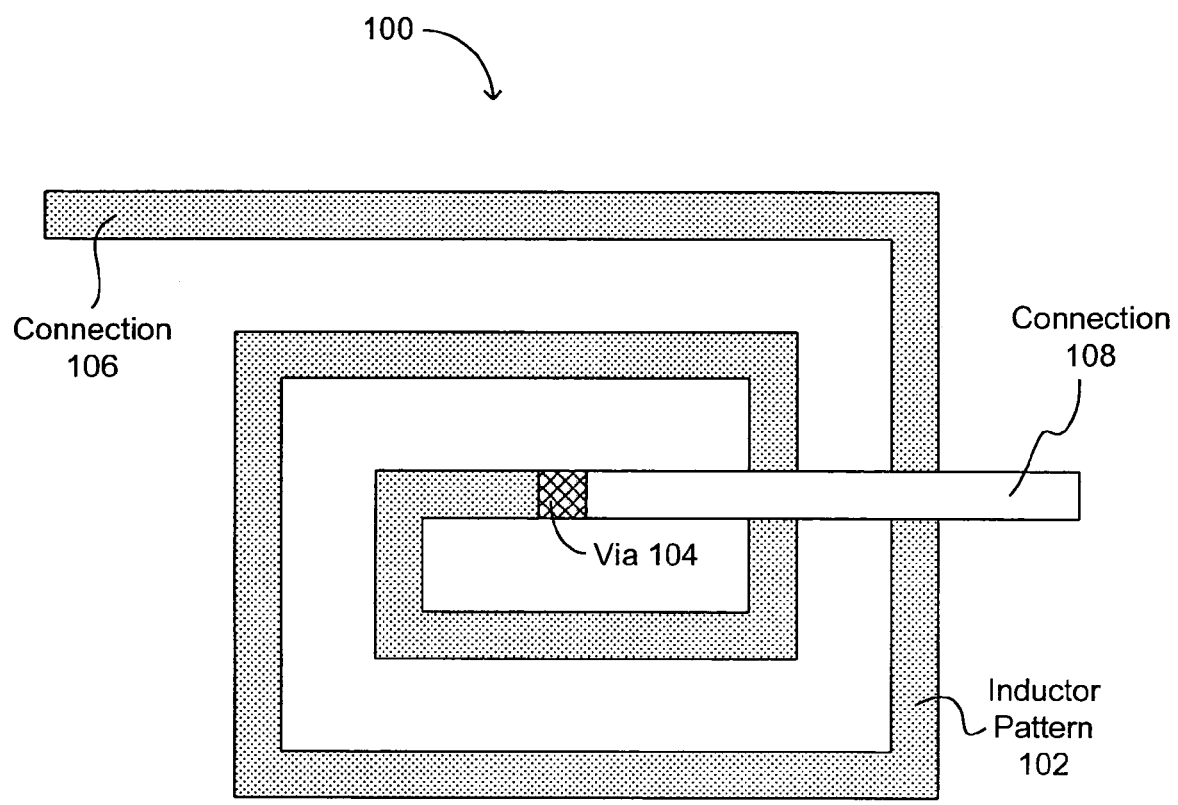
FIG. 1 (conventional)

INTEGRATED RESONATOR STRUCTURE AND METHODS FOR ITS MANUFACTURE AND USE

FIELD OF THE INVENTION

The present invention generally relates to the field of certain passive components for integrated circuits. More specifically, embodiments of the present invention pertain to methods and structures for an integrated resonator useful for radio frequency (RF) circuits.

DISCUSSION OF THE BACKGROUND

An inductor-capacitor (LC) resonator "tank" is a useful component in many integrated circuits (ICs) and IC applications. For example, integrated oscillators typically use such an LC tank to set the center of the resonant frequency. Similarly, voltage controlled oscillators (VCOs) typically use a fixed LC resonator tank (in one case, in combination with a variable capacitance [varactor] diode) to control oscillator frequency. In integrating an LC tank on the same semiconductor die with other circuit elements, the following design considerations are typically important: (i) losses due to parasitic effects (e.g., series resistance of the inductor coil) should be kept low for a high Q resonator; (ii) the resonator should be isolated from noise due to charge transfer in the semiconductor substrate; and (iii) the associated silicon area should be relatively small.

In one conventional approach (see, e.g., U.S. Pat. No. 5,915,188), an inductor and capacitor pattern are formed in a single layer of metal, and then the inductor and capacitor are covered with a dielectric and a top metal to form an integrated resonator. While such a structure can provide a high Q, drawbacks of this approach may include relatively low substrate shielding and a relatively small capacitance value.

In another conventional approach (see, e.g., U.S. Pat. No. 5,492,856), an inductor metal pattern can be formed over an oxide layer over a p-n junction on the surface of a silicon substrate to form a capacitor in parallel with the inductor. However, drawbacks of this approach may include relatively poor shielding and noise coupling due to the required biasing of the p-n junction.

In another conventional approach (see, e.g., U.S. Patent Pub. No. 2003/0142459), a multilayer capacitor structure can be used with the capacitor isolated from the substrate by a dielectric layer. An odd number of plates can be used so that a virtual ground can be formed with the center plate of the multiplate structure. However, an inductor may typically be separately formed in order to make an LC tank using this approach.

Referring now to FIG. 1, a top view diagram showing a conventional single layer spiral inductor is indicated by the general reference character 100. Inductor pattern 102 can be a substantially spiral pattern and the inductor can be formed in a single layer. Via 104 can be used to couple to another metal layer for connection 108. Connection 106 can be made directly in the same metal layer used to form the inductor. Accordingly, a cross-over metal (e.g., connection 108, formed in a different layer of metallization) may be required to allow connections to both sides of the inductor.

What is needed is an integrated LC resonator tank having relatively high shielding from the semiconductor substrate. Further, it is desirable to reduce or minimize parasitic effects on the inductor to provide a relatively high Q resonator. In addition, it is desirable to form an LC resonator structure using conventional integrated circuit processing techniques, without the use of cross-over metal for the inductor connections.

SUMMARY OF THE INVENTION

The present invention relates to improved integrated LC resonator structures, and methods for making and using the same.

In one aspect, the present integrated resonator can include: (i) a first capacitor plate in a first integrated circuit layer; (ii) an inductor in a second integrated circuit layer, over and in electrical communication with the first capacitor plate; and (iii) a second capacitor plate in a third integrated circuit layer, over and in electrical communication with the inductor. In various embodiments, the first capacitor plate comprises a lower metal layer structure, the inductor comprises an intermediate metal layer structure on or in a first dielectric layer (which, in turn, may be on the first capacitor plate), the inductor is electrically coupled to the first capacitor plate by a first via through the first dielectric layer, the second capacitor plate comprises an upper metal layer structure on or in a second dielectric layer (which, in turn, may be on the inductor), and the second capacitor plate is electrically coupled to the inductor by a second via through the second dielectric layer. Further, the first capacitor plate may be on or in a third dielectric layer, which may be directly on a semiconductor substrate, for example. Alternatively, the third dielectric layer may be on a polysilicon shielding layer, which may be on a fourth dielectric layer, and the fourth dielectric layer may be on the semiconductor substrate, for example.

In one embodiment, a shielding layer may include a bottom plate of a capacitor and be configured to limit a current between an integrated resonator and a semiconductor substrate. The capacitor can further include a top plate, with the top and bottom capacitor plates coupled to a single layer inductor. The bottom capacitor plate can be on or in a first dielectric layer. The first dielectric layer can be on: (i) the semiconductor substrate; and/or (ii) a shielding layer configured to shield the inductor from a current in the semiconductor substrate, a second dielectric layer being between with the shielding layer and the substrate. Further, the shielding layer may comprise or consist essentially of polysilicon and/or be electrically coupled to a predetermined voltage, such as a ground level.

In another aspect of the invention, a method of making an integrated resonator includes the steps of: (i) forming a first capacitor plate; (ii) forming a first dielectric layer having a first via hole therein on the first capacitor plate; (iii) forming a first via in the first via hole and an inductor on or in the first dielectric layer; (iv) forming a second dielectric layer having a second via hole therein on the inductor; and (v) forming a second via in the second via hole and a second capacitor plate on or in the second dielectric layer. The inductor can be formed in or may consist essentially of a single layer of metal and the inductor can also be substantially spiral in shape, for example.

Embodiments of the present invention can advantageously provide an integrated LC resonator tank having relatively high shielding from the semiconductor substrate. Further, embodiments of the present invention can advantageously reduce or minimize parasitic effects on the inductor to provide a relatively high Q resonator. In addition, the LC resonator structure can be manufactured using conventional integrated circuit processing techniques. These and other advantages of the present invention will become readily apparent from the detailed description of preferred embodiments below.

BRIEF DESCRIPTION OF THE DRAWINGS

FIG. 1 is a top view diagram showing a conventional single layer spiral inductor.

DETAILED DESCRIPTION OF THE PREFERRED EMBODIMENTS

Figure 2:
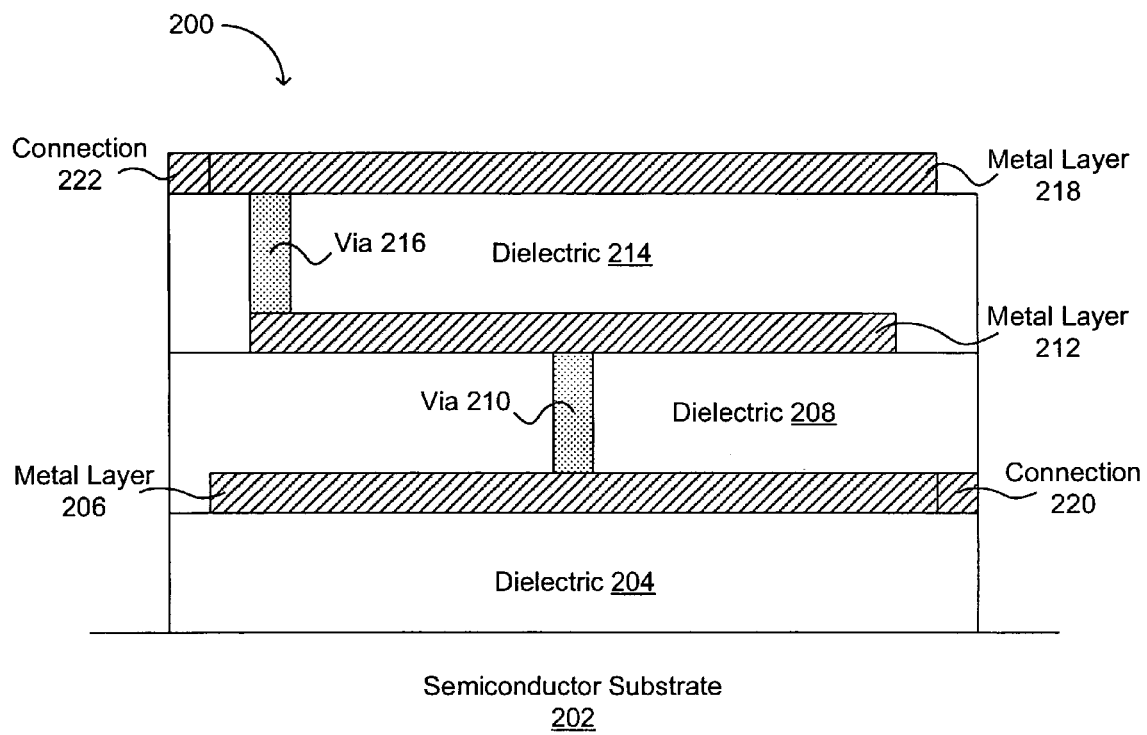
FIG. 2 is a cross-sectional diagram showing an integrated resonator according to an embodiment of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

In the context of this application, the terms "wire," "wiring," "line," "signal," "conductor," "conduit" and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Similarly, for convenience and simplicity, the terms "clock," "time," "timing," "rate," "period" and "frequency" are, in general, interchangeable and may be used interchangeably herein, but are generally given their art-recognized meanings. Also, for convenience and simplicity, the terms "connected to," "coupled with," "coupled to," and "in communication with" (which may refer to direct or indirect connections, couplings, or communications) may be used interchangeably, but these terms are generally given their art-recognized meanings herein.

Embodiments of the present invention relate to methods, processing techniques, structures, and/or circuits for an improved integrated LC resonator. For example, an integrated resonator can include: (i) a first capacitor plate in a first integrated circuit layer; (ii) an inductor in a second integrated circuit layer, over and in electrical communication with the first capacitor plate; and (iii) a second capacitor plate in a third integrated circuit layer, over and in electrical communication with the inductor. In various embodiments, the first capacitor plate comprises a lower metal layer structure, the inductor comprises an intermediate metal layer structure on or in a first dielectric layer (which, in turn, may be on the first capacitor plate), the inductor is electrically coupled to the first capacitor plate by a first via through the first dielectric layer, the second capacitor plate comprises an upper metal layer structure on or in a second dielectric layer (which, in turn, may be on the inductor), and the second capacitor plate is electrically coupled to the inductor by a second via through the second dielectric layer. Further, the first capacitor plate may be on or in a third dielectric layer, which may be directly on a semiconductor substrate, for example. Alternatively, the third dielectric layer may be on a shielding layer, which may be on a fourth dielectric layer that is on the semiconductor substrate, for example.

In one aspect, a shielding layer, which may include a bottom plate of a capacitor, can be configured to limit or reduce a current induced in the resonator by a current in the semiconductor substrate. The bottom capacitor plate can be on a first dielectric layer, which can be on: (i) the semiconductor substrate; and/or (ii) a shielding layer on or in a second dielectric layer, the second dielectric layer being on or over the semiconductor substrate. Further, the shielding layer may comprise or consist essentially of polysilicon and/or be coupled to a predetermined voltage, such as ground.

In a further aspect of the invention, a method of making an integrated resonator can include the steps of: (i) forming a first capacitor plate; (ii) forming a first dielectric layer having a first via hole therein on the first capacitor plate; (iii) forming a first via in the first via hole and an inductor on or in the first dielectric layer; (iv) forming a second dielectric layer having a second via hole therein on the inductor; and (v) forming a second via in the second via hole and a second capacitor plate on or in the second dielectric layer. The inductor can be formed in or may consist essentially of a single layer of metal and may be substantially spiral in shape, for example.

Embodiments of the present invention can advantageously provide an integrated LC resonator tank having relatively high shielding from the semiconductor substrate. Further, embodiments of the present invention can advantageously reduce or minimize parasitic effects on the inductor to provide a relatively high Q resonator. In addition, the LC resonator structure can be manufactured using conventional integrated circuit processing techniques. The invention, in its various aspects, will be explained in greater detail below with regard to exemplary embodiments.

A First Exemplary Integrated Resonator

A first exemplary integrated resonator can include: (i) a first capacitor plate in a first integrated circuit layer; (ii) an inductor in a second integrated circuit layer, over and in electrical communication with the first capacitor plate; and (iii) a second capacitor plate in a third integrated circuit layer, over and in electrical communication with the inductor. Thus, the resonator may comprise (i) a means for providing an inductance for the resonator and (ii) first and second means for coupling a capacitance to the inductance providing means, where the inductance providing means is between the first capacitance coupling means and the second capacitance coupling means. Further, the first capacitor plate (or first capacitance coupling means) may be on or in a dielectric layer, and the dielectric layer may be directly on a semiconductor substrate.

Referring now to FIG. 2, a cross-sectional diagram showing an integrated resonator according to an embodiment of the present invention is indicated by the general reference character 200. Semiconductor substrate 202 can be a silicon substrate, for example. Dielectric 204 can be deposited or grown on semiconductor substrate 202 by conventional techniques (e.g., chemical vapor deposition or wet or dry thermal oxidation). Metal layer 206 can be deposited on dielectric 204 by conventional techniques (e.g., sputtering or physical or chemical vapor deposition). Metal layer 206 generally comprises a bottom capacitor plate. Connection 220, in the same layer of metallization as metal layer 206, can comprise a terminal or node to provide a connection to another circuit, for example by a bus, line or conduit (not shown). Dielectric 208 can be deposited on metal layer 206, and via 210 can be conventionally formed in dielectric 208 (e.g., by photolithographic patterning and etching of a via hole in dielectric layer 208, followed by deposition of via material into the via hole and onto dielectric layer 208, and removal of excess via material from outside the via hole by chemical mechanical polishing). Metal layer 212 can then be conventionally deposited on dielectric 208. Metal layer 212 can also be conventionally patterned and/or etched to form a single layer inductor. One such pattern or shape may be a substantially spiral pattern. Dielectric 214 can be deposited on metal layer 212 and those portions of dielectric 208 where metal layer 212 has been etched. Via 216 can be formed in dielectric 214, and metal layer 218 can then be deposited on dielectric 214. Metal layer 218 generally comprises a top capacitor plate. Connection 222, in the same layer of metallization as metal layer 218, can be a terminal or node to provide a connection to another circuit, for example by a bus, line or conduit (not shown).

Each metal layer forming a capacitor plate or inductor may comprise one or more individual metal layers, conventionally formed or stacked on one another. Thus, as the term is used herein, a "layer" or "single layer" of metal or metallization may include a multi-layer metallization structure. For example, each of metal layers 206, 212 and 218 may comprise a conventional adhesive layer (e.g., Ti), a barrier layer (e.g., titanium nitride), a bulk conductor (e.g., Al, which may contain up to 4 wt. % of an alloying metal such as Ti, Si and/or Cu), an optional adhesive or surface smoothing layer (e.g., Ti), and a hillock suppression or anti-reflective layer (e.g., titanium nitride or TiW alloy). The bottom capacitor plate (e.g., metal layer 206) could alternatively comprise polysilicon instead of metal. Such polysilicon could be conventionally doped and/or silicided (e.g., with a metal such as tungsten, molybdenum, titanium, cobalt, nickel, etc.) to improve the conductivity and work function of the bottom capacitor plate.

Figure 3:
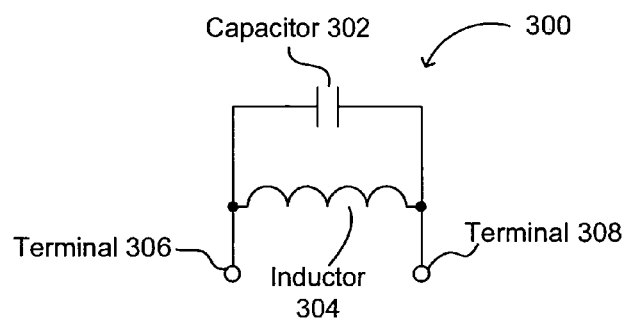
FIG. 3 is a schematic diagram showing an equivalent circuit of the integrated resonator according to embodiments of the present invention.

Via 210 can provide a connection between the single layer inductor (e.g., metal layer 212) and the bottom capacitor plate (e.g., metal layer 206). Similarly, via 216 can provide a connection between the single layer inductor and the top capacitor plate (e.g., metal layer 218). Referring now to FIG. 3, a schematic diagram showing an equivalent circuit of the integrated resonator according to embodiments of the present invention is indicated by the general reference character 300. The connections to the top and bottom plates of the capacitor can eliminate the need for the crossover metal discussed above with reference to FIG. 1. Viewing FIG. 3 in conjunction with FIG. 2, the plates of capacitor 302 can correspond to metal layer 206 (e.g., the bottom capacitor plate) and metal layer 218 (e.g., the top capacitor plate), inductor 304 can correspond to metal layer 212, terminal or node 306 can correspond to one of connections 220 or 222, and terminal or node 308 can correspond to the other of connections 220 or 222, for example. Such terminals (e.g., terminals 306 and 308) can be used to connect LC circuit 300 to other components to form a circuit, such as a circuit for controlling a periodic signal frequency (e.g., a clock circuit).

Damascene processing, as an alternative or in addition to photolithographic processing, may also be used to form structures in one or more metal layers in accordance with embodiments of the invention. A dual-damascene process, typically used for copper metallization, can be used in place of conventional aluminum metallization processing, for example. In conventional aluminum metallization, subtractive (or photolithographic) line formation is generally used. Such subtractive line formation generally uses dry-etching to remove unwanted aluminum portions from a deposited film or layer of aluminum to leave the metal lines. However, because copper generally does not form a volatile by-product and is difficult to dry-etch, it is desirable to use another method to form copper metal lines. One such method is to first dry-etch recesses (e.g., trenches and vias) into a dielectric layer and then fill those recesses with copper metallization. In one embodiment, the vias are etched into the dielectric first, followed by the trenches (the so-called "via first" technique). In an alternative approach, the trenches are etched into the dielectric first, followed by the vias (the so-called "trench first" technique). In either case, the dielectric layer may comprise three sublayers: a lower via dielectric, an etch stop layer, and an upper trench dielectric. The via and trench dielectric sublayers may comprise an oxide (e.g., a doped or undoped silicon [di] oxide), and the etch stop may comprise a nitride (e.g., silicon nitride). Alternatively, the dielectric layer may comprise a fluorine-doped oxide sublayer (having a relatively high dielectric constant) between relatively thin upper and lower undoped oxide sublayers, in which case the etch stop layer may be omitted.

After filling the recesses with copper metallization (generally by first depositing a thin barrier layer, such as tantalum nitride, by chemical vapor deposition, then electroplating the copper, which may be performed in two stages), chemical mechanical polishing can then be used to polish down to the surface of the dielectric layer any excess copper over the recesses and the dielectric. Similarly, conventional damascene techniques can also be employed to form inter-level connections, such as vias. Accordingly, depending on the particular materials chosen (e.g., copper instead of aluminum), a damascene process may be used to form the top and bottom capacitor plates, the inductor, and/or the vias connecting the inductor to the capacitor plates, for example.

Figure 4:
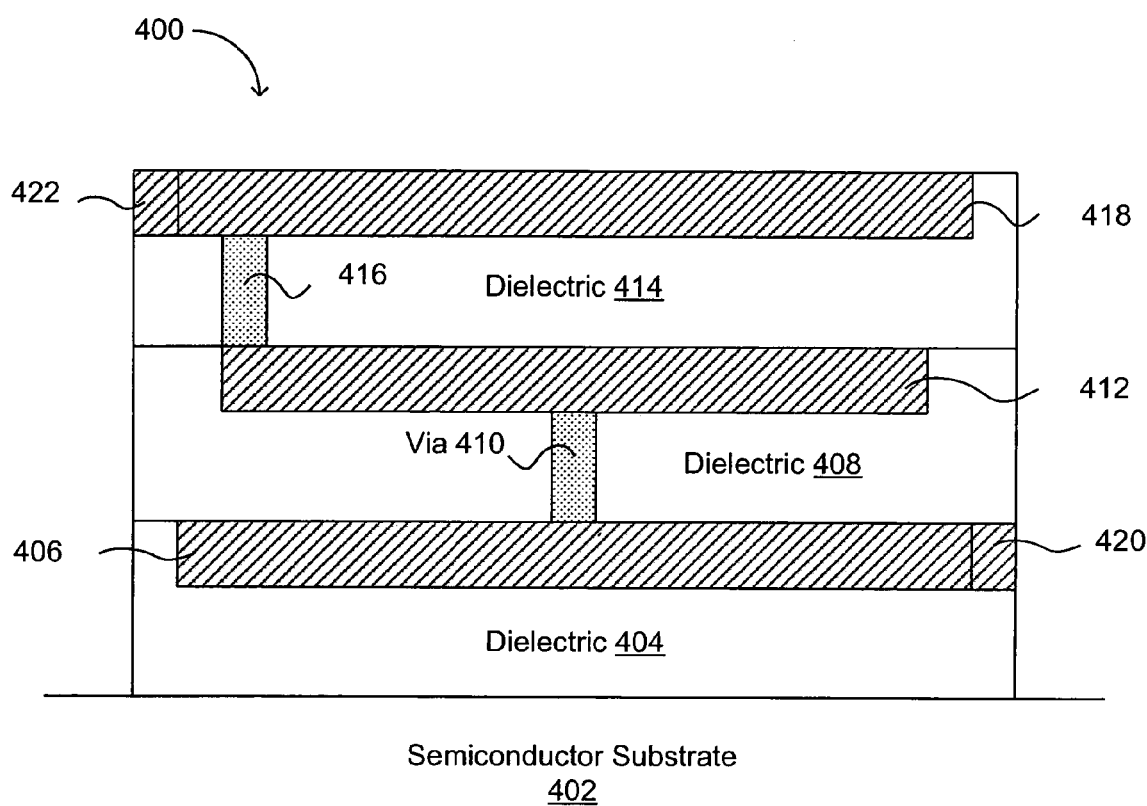
FIG. 4 is a cross-sectional diagram showing an integrated resonator made with a dual-damascene process according to an embodiment of the present invention.

Referring now to FIG. 4, a cross-sectional diagram showing an integrated resonator made with a dual-damascene process according to an embodiment of the present invention is indicated by the general reference character 400. Semiconductor substrate 402 can comprise a silicon substrate, for example. As discussed above, metal layer 406 can fill a recess etched into dielectric 404 to form a bottom capacitor plate. Connection 420, in the same layer of metallization as metal layer 406, can comprise a terminal or node (such as terminal 306 of FIG. 3, for example) to provide a connection to another circuit. Dielectric 408 can be deposited on metal layer 406 and dielectric 404, then recesses for via 410 and metal layer 412 can be formed in dielectric 408. Metallization can then fill the recesses in dielectric 408 to form via 410 and metal layer 412. Accordingly, while via 410 and metal layer 412 are labeled as separate structures in FIG. 4, the process may form them as a unitary structure. Metal layer 412 can form an inductor, such as a substantially spiral shaped metal pattern. Dielectric 414 can be deposited on metal layer 412 and dielectric 408, then via 416 and metal layer 418 (and connection 422) can be formed in previously-etched recesses in dielectric 414. Metal layer 418 generally comprises a top capacitor plate. Connection 422, in the same layer of metallization as metal layer 418, can be a terminal or node (such as terminal 308 of FIG. 3, for example) to provide a connection to another circuit.

Figure 5:
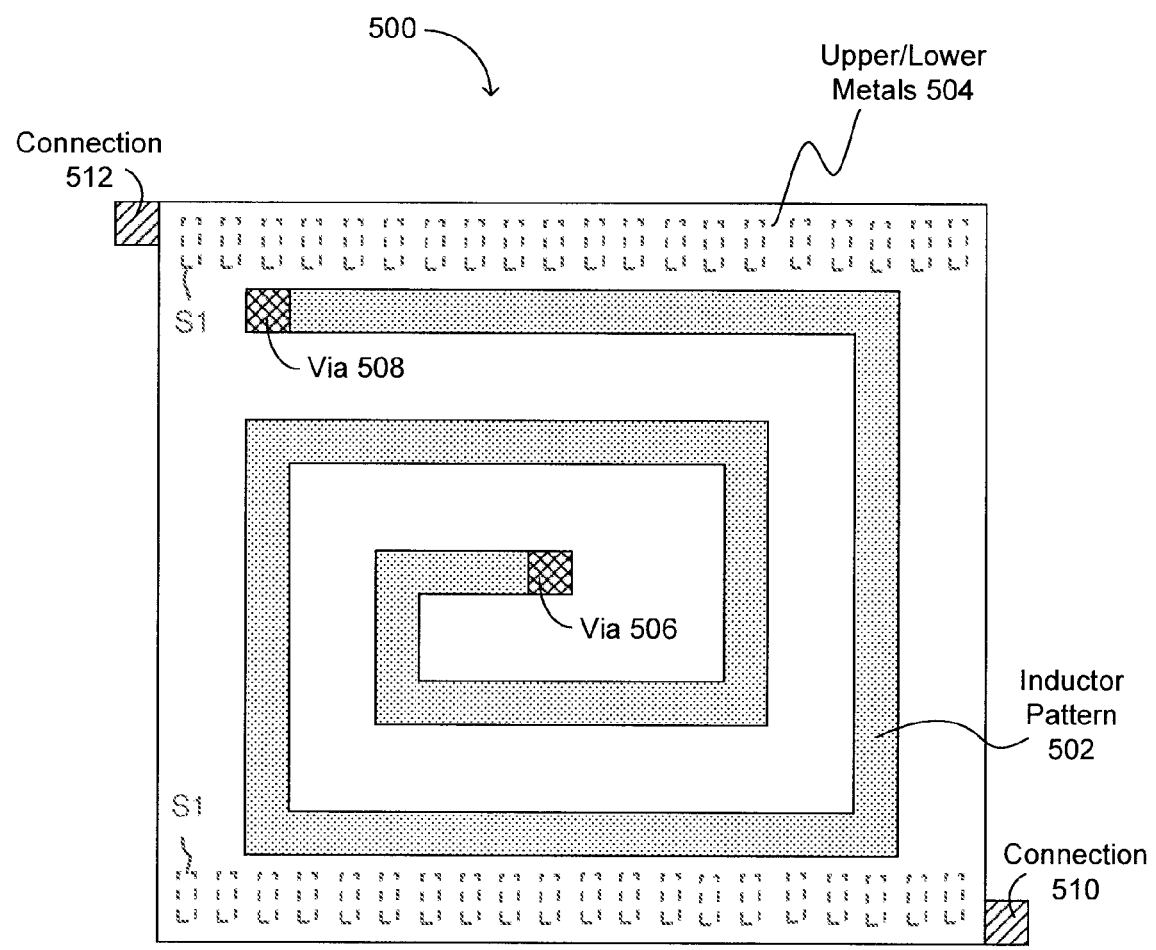
FIG. 5 is a top view diagram showing the integrated resonator of FIG. 2 or FIG. 4.

Referring now to FIG. 5, a top view diagram showing the integrated resonator of FIG. 2 or FIG. 4 is indicated by the general reference character 500. Inductor pattern 502 can be a substantially spiral pattern, and the inductor can be formed in or may consist essentially of a single layer (e.g., metal layer 212 of FIG. 2). Upper/lower metals 504 can include metal layer 206 (e.g., the bottom capacitor plate) and metal layer 218 (e.g., the top capacitor plate), as shown in FIG. 2, for example, or metal layers 406 and 418, as shown in FIG. 4. Further, connection 510 can correspond to one of connections 220 and 222 of FIG. 2 (or one of connections 420 and 422 of FIG. 4) and connection 512 can correspond to the other of connections 220 and 222 of FIG. 2 (or the other of connections 420 and 422 of FIG. 4) to provide terminals or nodes for access by other circuits. Via 506 can be used to couple inductor pattern 502 to another metal layer, such as metal layer 206 (see FIG. 2). Similarly, via 508 can be used to couple inductor pattern 502 to metal layer 218 (see FIG. 2). Accordingly, no cross-over metal (e.g., connection 108 of FIG. 1) is required to allow connections to both sides of the inductor according to embodiments of the present invention.

The magnetic field induced by current in the spiral inductor pattern (e.g., inductor pattern 502 in FIG. 5) is perpendicular to the plane of metallization. So, the magnetic field direction would be into or out of the plane of the page when viewing FIG. 5, depending on the direction of the current through the inductor. Without capacitor plates (e.g., upper/lower metals 404), this magnetic field could induce substrate noise (e.g., in semiconductor substrate 202 of FIG. 2) that may result in disturbance of adjacent circuit elements. Of course, the reverse phenomenon may also take place, in that a current in the semiconductor substrate can create a magnetic field that induces a current in the inductor. The presence of the capacitor plates can provide a shielding effect, allowing other circuit elements (e.g., on the substrate) to be placed closer to the integrated inductor than would otherwise be possible. In addition, the energy in the magnetic field is partially transferred to the capacitor structure, thereby increasing the Q of the structure. These shielding and energy transfer effects may be further enhanced through patterning of the top and bottom capacitor plates using slots, S1 for example, shown in dotted lines.

A Second Exemplary Integrated Resonator

According to further embodiments of the present invention, a second exemplary integrated resonator can further include a shielding layer, in which case the first capacitor plate may be on or in a first dielectric layer, and the first dielectric layer may be on the shielding layer. In turn, the shielding layer may be on or in a second dielectric layer and the second dielectric layer may be on a semiconductor substrate. The shielding layer may comprise a metal (as described herein, for example) and/or polysilicon.

Figure 6:
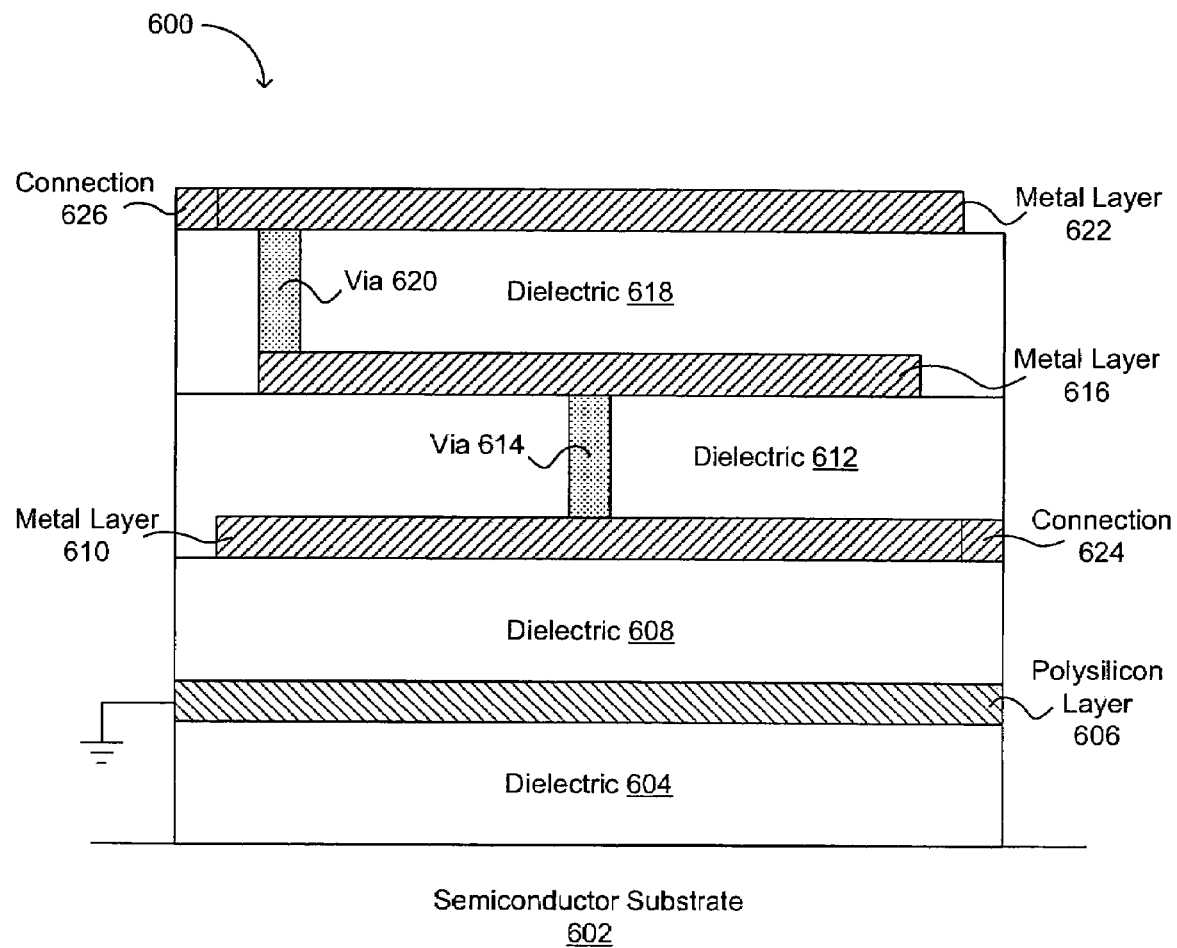
FIG. 6 is a cross-sectional diagram showing an integrated resonator according to an alternate embodiment of the present invention.

Referring now to FIG. 6, a cross-sectional diagram showing an integrated resonator according to an alternate embodiment of the present invention is indicated by the general reference character 600. Semiconductor substrate 602 can be a silicon substrate, for example. Dielectric 604 can be deposited or grown on semiconductor substrate 602 by conventional techniques (e.g., chemical vapor deposition or wet or dry thermal oxidation). Polysilicon layer 606 can be deposited on dielectric 604 by conventional techniques. Polysilicon layer 606 can provide an additional shielding layer to the shielding provided by the bottom capacitor plate, as discussed above. Further, polysilicon layer 606 may be connected to a predetermined voltage (such as ground) or other low impedance node. When connected to ground, such a ground connection can effectively shunt charge induced in polysilicon layer 606 by a substrate current into the low impedance ground. Dielectric 608 can be deposited on polysilicon layer 606 and metal layer 610 can be deposited on dielectric 608 by conventional techniques. Metal layer 610 generally comprises a bottom capacitor plate that may also provide additional shielding to/from semiconductor substrate 602. Connection 624, in the same layer of metallization as metal layer 610, can be a terminal or node to provide a connection to another circuit.

Dielectric 612 can be deposited on metal layer 610 and dielectric 608 by conventional techniques, and via 614 can be conventionally formed in dielectric 612 (e.g., by photolithographic patterning and etching of a via hole in dielectric layer 612, followed by deposition of via material into the via hole and onto dielectric layer 612, and removal of excess via material from outside the via hole by chemical mechanical polishing). Metal layer 616 can then be conventionally deposited on dielectric 612. Metal layer 616 can also be conventionally patterned and/or etched to form a single layer inductor, as described herein. Dielectric 618 can be deposited on metal layer 616 and on dielectric 612 where the metal layer 616 has been etched. Via 620 can be formed in dielectric 618, and metal layer 622 can then be deposited on dielectric 618. Metal layer 622 generally comprises a top capacitor plate. Connection 626, in the same layer of metallization as metal layer 622, can be a terminal or node to provide a connection to another circuit. As described above, the bottom capacitor plate may alternatively or additionally comprise polysilicon, which may be conventionally doped and/or silicided (e.g., with a metal such as tungsten, molybdenum, titanium, cobalt, nickel, etc.) to improve the conductivity and work function of the bottom capacitor plate. Via 614 can provide a connection between the single layer inductor (e.g., metal layer 616) and the bottom capacitor plate. Similarly, via 620 can provide a connection between the single layer inductor and the top capacitor plate (e.g., metal layer 622).

An Exemplary Method of Making an Integrated Resonator

A further aspect of the invention relates to an exemplary method of making an integrated resonator, including the steps of: (i) forming a first capacitor plate; (ii) forming a first dielectric layer having a first via hole therein on the first capacitor plate; (iii) forming a first via in the first via hole and an inductor on or in the first dielectric layer; (iv) forming a second dielectric layer having a second via hole therein on the inductor; and (v) forming a second via in the second via hole and a second capacitor plate on or in the second dielectric layer. The inductor can be formed in or from, or may consist essentially of, a single layer of metal (which may include a bulk conductor layer, an adhesive layer and/or a barrier layer under the bulk conductor layer, and an antireflective layer and/or hillock suppression layer on the bulk conductor layer). The inductor can also comprise a number (e.g., a plurality) of concentric rings of any shape (e.g., square, rectangular, oval, etc.). In one embodiment, the inductor may be substantially spiral in shape, for example.

Figure 7:
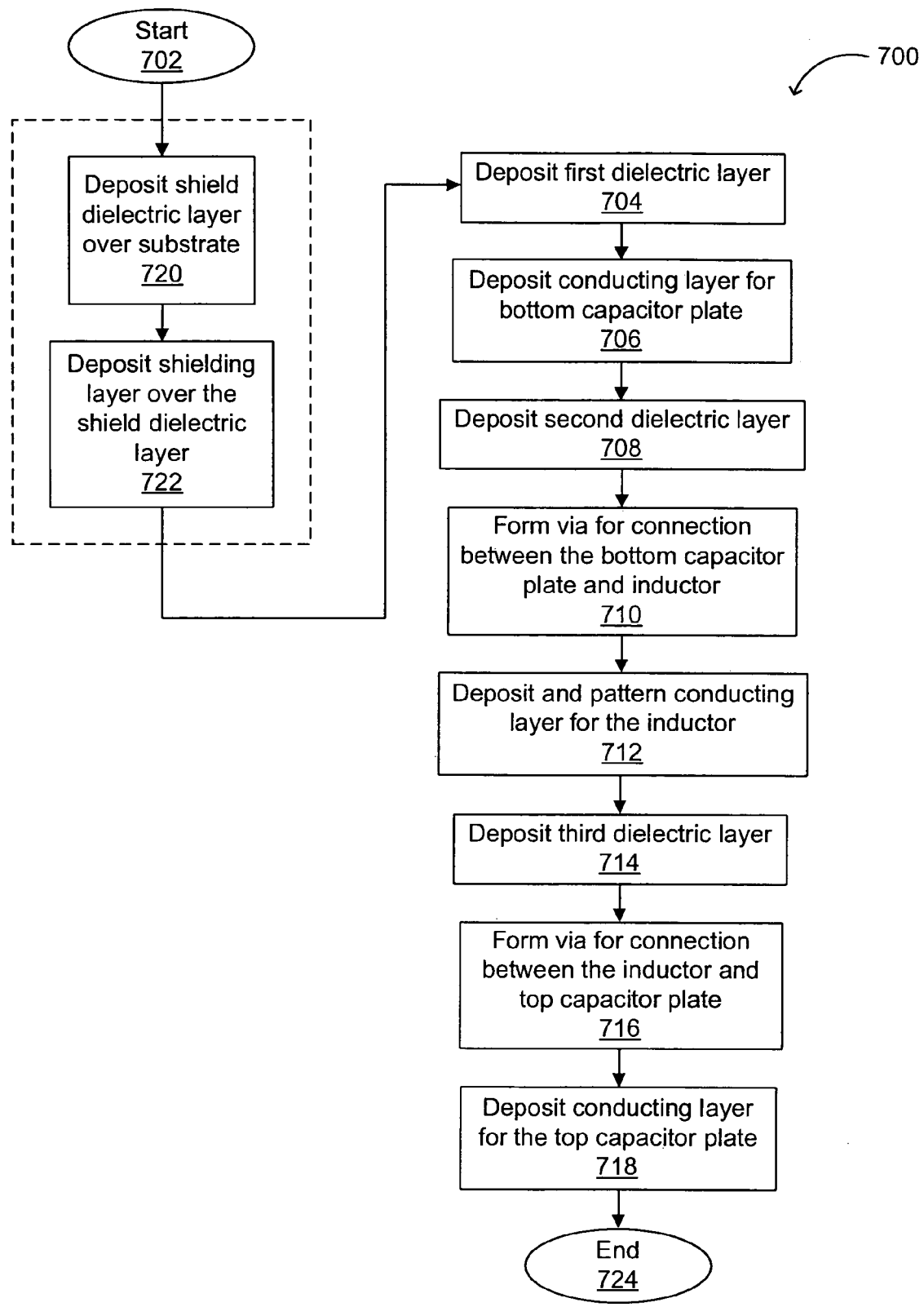
FIG. 7 is a flow diagram of a method of making an integrated resonator according to embodiments of the present invention.

Referring now to FIG. 7, a flow diagram of a method of making an integrated resonator according to embodiments of the present invention is indicated by the general reference character 700. Start (702) can begin the flow and, for the first exemplary integrated resonator structure as described above, the flow can proceed to deposition or formation of the first dielectric layer (704). However, for the second exemplary integrated resonator structure as described above, the flow can first include the additional steps of depositing a shield dielectric layer over the substrate (720) and depositing or forming a shielding layer (which may comprise or consist essentially of polysilicon) over the shield dielectric layer (722). After formation of the first dielectric layer (704), a conducting layer for the bottom capacitor plate can be deposited (706). This conducting layer may comprise metal or doped and/or silicided polysilicon.

A second dielectric layer can then be deposited or otherwise formed (708), and a via can be formed through the second dielectric layer (710). This via can allow for a connection between the bottom capacitor plate and an inductor. The inductor can then be formed by depositing and patterning a second conducting layer (712). Such patterning can result in a substantially spiral shaped inductor, for example. A third dielectric layer can then be deposited (714), and a via can be formed through the third dielectric layer (716). This via can allow for a connection between the inductor and a top capacitor plate. A third conducting layer (e.g., comprising a metal as described herein), can then be deposited to form the top capacitor plate (718), and the flow can complete (724). As discussed above, other conventional processing techniques, such as damascene metallization, as opposed to traditional photolithography, may also be used for one or more of the above processing steps in accordance with embodiments of the present invention.

In this fashion, an improved LC resonator tank can be manufactured using conventional integrated circuit processing techniques. Embodiments of the present invention can advantageously provide an integrated LC resonator tank having relatively high shielding from and/or to the semiconductor substrate. Further, embodiments of the present invention can advantageously provide a high Q resonator by reducing or minimizing parasitic effects.

An Exemplary Method of Shielding a Resonator Tank

In another aspect, the present invention concerns a method of shielding a resonator, comprising forming a shielding layer over a semiconductor substrate, then forming the resonator above the shielding layer. Generally, the resonator comprises the present integrated resonator (e.g., a bottom capacitor plate in a first metal layer; an inductor in a second metal layer, over and in electrical communication with the bottom capacitor plate; and a top capacitor plate in a third metal layer, over and in electrical communication with the inductor). Naturally, the resonator may be formed by the exemplary methods described herein. The shielding layer can be configured to reduce, limit or minimize a current induced in the resonator by a corresponding current in the semiconductor substrate. Further, as described herein, the shielding layer may comprise polysilicon, and the method may further comprise coupling the shielding layer to a predetermined voltage (such as ground) or other low impedance node.

As discussed above, the capacitor plates may help to prevent the magnetic field caused by current from the inductor to induce substrate noise that may result in disturbance of adjacent circuit elements. The presence of the shielding layer allows other circuit elements to be placed relatively close to the integrated inductor. In addition, the energy in the magnetic field may be partially transferred to the capacitor structure, thereby increasing the Q of the structure. These shielding and energy transfer effects may be further enhanced through patterning of the top and bottom capacitor plates or using any suitable conventional technique to form slots, for example. Thus, embodiments of the present invention can advantageously reduce or minimize parasitic effects on the inductor to provide a relatively high Q resonator.

A Third Exemplary Integrated Resonator

A third exemplary integrated resonator can include: (i) a first capacitor plate in a first integrated circuit layer; (ii) a center-tapped inductor in a second integrated circuit layer, over and in electrical communication with the first capacitor plate; and (iii) a second capacitor plate in a third integrated circuit layer, over and in electrical communication with the center-tapped inductor. Thus, the resonator may comprise (i) a means for providing an inductance for a differential signal path or node, and (ii) first and second means for coupling a capacitance to the inductance providing means, where the inductance providing means is between the first capacitance coupling means and the second capacitance coupling means.

Figure 8:
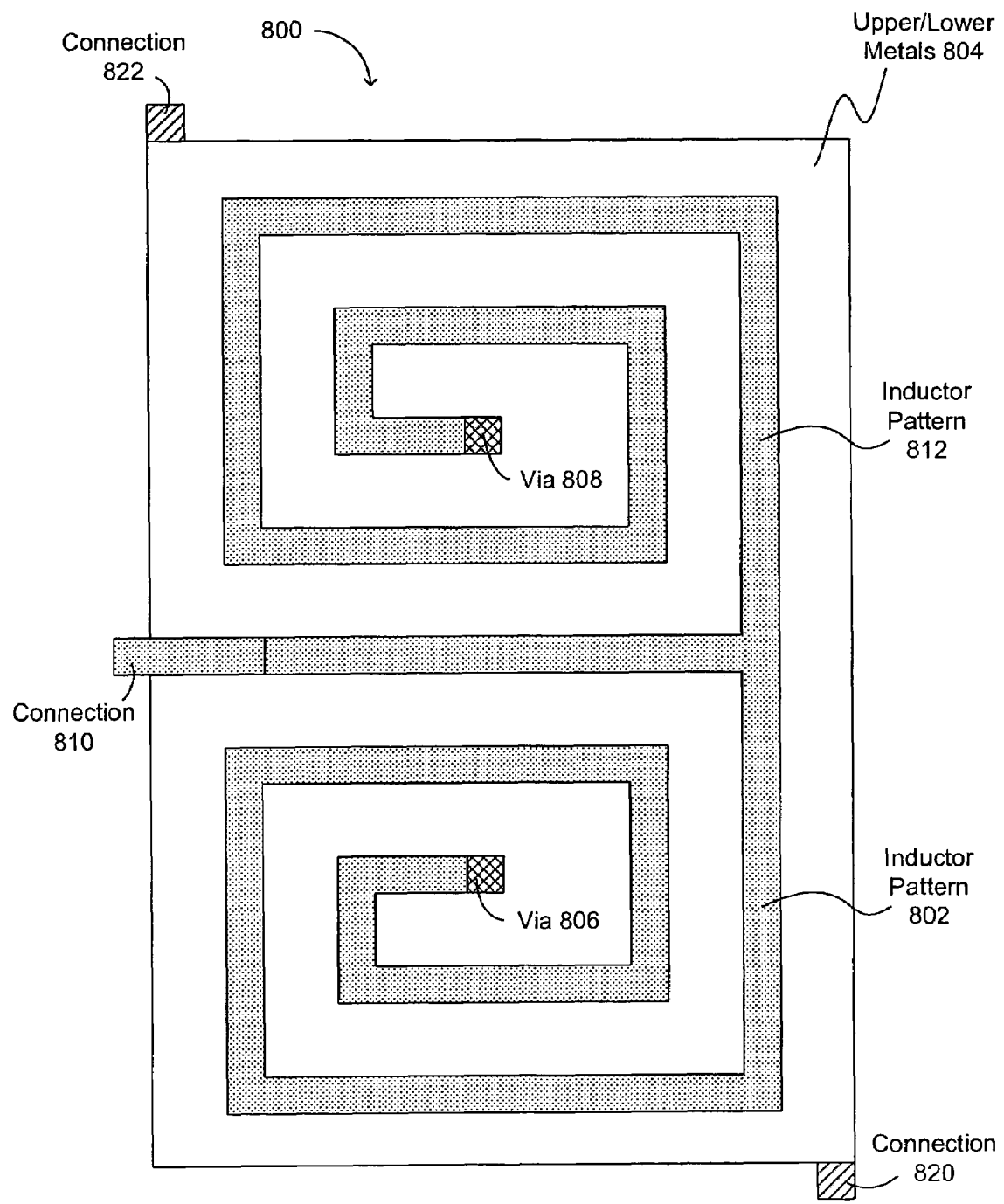
FIG. 8 is a top view diagram showing a center-tapped integrated resonator according to an embodiment of the present invention.

FIG. 8 shows a top view diagram of an exemplary center-tapped integrated resonator structure according to an embodiment of the present invention, indicated by the general reference character 800. The center-tapped inductor generally includes inductor pattern 802 and inductor pattern 812. Each inductor pattern can be a substantially spiral shape and can be formed in, or consist essentially of, a single metal layer. Upper/lower metal layers 804 generally correspond to the top and bottom capacitor plates, for example, and may be adapted to include respective connections 820 and 822 for electrical communication with other circuit components (e.g., for connection between stages of a differential oscillator circuit). Further, connection 810 is the center-tap connection, generally configured to provide access to a predetermined voltage or power supply, for example. Via 806 generally couples inductor pattern 802 to another metal layer 804, such as the bottom or top capacitor plate of the resonator. Similarly, via 808 generally couples inductor pattern 812 to another metal layer 804, such as the other capacitor plate of the resonator.

Figure 9:
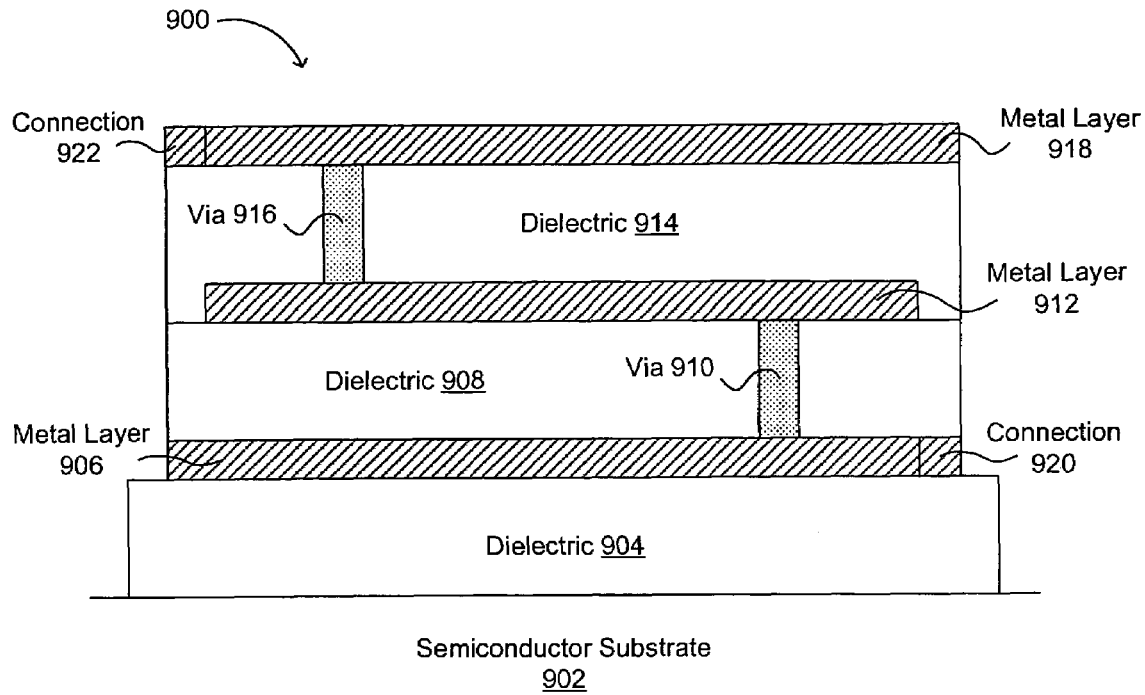
FIG. 9 is a cross-sectional diagram showing the center-tapped integrated resonator of FIG. 8.

FIG. 9 shows a cross-sectional diagram of the center-tapped integrated resonator of FIG. 8, viewed along the center tap (i.e., collinear with connection 810) and indicated by the general reference character 900. The center-tapped integrated resonator 900 is generally similar to the exemplary resonator of FIG. 2. Thus, for example, semiconductor substrate 902 can be a silicon substrate. Dielectric 904 can be deposited or grown on semiconductor substrate 902 by conventional techniques. Metal layer 906 can be deposited on dielectric 904 by conventional techniques and be patterned and etched conventionally to form (among other things) a bottom capacitor plate. Connection 920, in the same layer of metallization as metal layer 906, can be a terminal or node to provide a connection to another circuit, for example to one path of a differential oscillator configured to generate one or more periodic (e.g., clock) signals. Dielectric 908 can be deposited on metal layer 906, and via 910 can be conventionally formed in dielectric 908, followed by conventional formation of via 910. Metal layer 912 can be conventionally deposited on dielectric 908 and conventionally patterned and etched to form a single layer, center-tapped inductor. Dielectric 914 can be deposited on metal layer 912 (and on dielectric 908 where metal layer 912 has been etched), and via 916 can be formed in dielectric 914. Metal layer 918 can then be deposited on dielectric 914 and patterned and etched in the same manner as metal layers 906 and 912. Metal layer 918 generally comprises a top capacitor plate. Connection 922, in the same layer of metallization as metal layer 918, can be a terminal or node to provide a connection to another circuit, for example to another path of the differential oscillator. Generally, when connection 920 is connected to a true path in a differential oscillator arrangement, connection 922 may be connected to a corresponding complement path in the differential oscillator.

Via 910 generally connects one terminal of the center-tapped inductor (e.g., metal layer 912) to the bottom capacitor plate (e.g., metal layer 906). Via 916 generally connects another terminal of the center-tapped inductor to the top capacitor plate (e.g., metal layer 918). The center-tap of the inductor may be accessed through a connection (not shown in FIG. 9) in metal layer 912. Of course, the locations of vias 910 and 916 at the terminals of inductor 912 can be exchanged.

Figure 10:
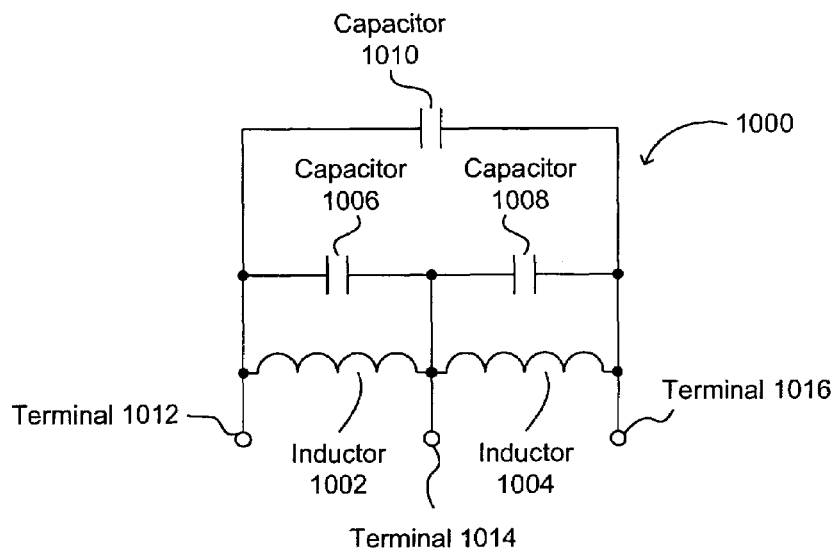
FIG. 10 is a schematic diagram showing an equivalent circuit of a center-tapped resonator according to embodiments of the present invention.

FIG. 10 shows a schematic diagram of an equivalent circuit of a center-tapped resonator according to embodiments of the present invention, indicated by the general reference character 1000. Viewing FIG. 10 in conjunction with FIGS. 8-9, capacitor 1010 can correspond to metal layers 906 and 918 in FIG. 9, inductors 1002 and 1004 can correspond to inductor patterns 802 and 812 in FIG. 8, terminal or node 1012 can correspond to one of connections 920 and 922 in FIG. 9, terminal or node 1016 can correspond to the other of connections 920 and 922 in FIG. 9, and terminal or node 1014 can correspond to the center-tapped connection 810 in FIG. 8, for example. Capacitors 1006 and 1008 may represent parasitic capacitances between the inductor patterns 802 and 812 (see FIG. 8) and the top/bottom capacitor plates (e.g. metal layers 906 and 918 in FIG. 9). Such terminals (e.g., terminals 1012, 1014 and 1016 in FIG. 10) can be used to connect LC circuit 1000 to other components to form a "resonator tank" circuit, such as for controlling a differential periodic signal frequency (e.g., a differential clock circuit). In particular, LC circuit 1000 may reduce the sensitivity of a differential oscillator circuit to power supply noise, as each inductor leg (e.g., inductor patterns 802 and 812 in FIG. 8 or inductors 1002 and 1012 in FIG. 10) responds similarly, if not identically, to such noise. Thus, in a further aspect, the invention may further relate to a method of controlling a periodic signal frequency, comprising generating a periodic signal having a frequency (e.g., as an output of an oscillator or VCO), and coupling said periodic signal to the present integrated resonator.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An integrated resonator, comprising:
   a capacitor and an inductor, said capacitor comprising a first capacitor plate and a second capacitor plate; wherein
   a) said first capacitor plate is in a first integrated circuit layer;
   b) said inductor is in a second integrated circuit layer, over and in electrical communication with said first capacitor plate; and
   c) said second capacitor plate is in a third integrated circuit layer, over and in electrical communication with said inductor.

2. The integrated resonator of claim 1, further comprising a first dielectric layer on said first capacitor plate, and a second dielectric layer on said inductor, wherein no other capacitor plates are located between said first capacitor plate and said second capacitor plate.

3. The integrated resonator of claim 2, wherein said inductor electrically communicates with (i) said first capacitor plate by a first via through said first dielectric layer and (ii) said second capacitor plate by a second via through said second dielectric layer; and
   wherein said first via contacts said inductor at a front region of said inductor said second via contacts said inductor at an end region of said inductor distant from said front region along a length of said inductor.

4. The integrated resonator of claim 1, wherein said first integrated circuit layer comprises a first metal layer.

5. The integrated resonator of claim 1, wherein said first capacitor plate lies over a semiconductor substrate and is configured to shield said integrated resonator from a current in said semiconductor substrate.

6. The integrated resonator of claim 1, wherein said inductor consists essentially of a single metallization layer.

7. The integrated resonator of claim 1, wherein:
   said first capacitor plate is coupled to a front region of said inductor;
   said second capacitor plate is a coupled to a back region of said inductor distant from said front region along the length of said inductor;
   said inductor further comprises a center-tap region located along the length of said inductor between said front region and back region;
   a contact node extends out from said resonator from said center-tap region.

8. A method of controlling a periodic signal frequency, comprising generating a periodic signal having a frequency, and coupling said periodic signal to the integrated resonator of claim 1.

9. The method of claim 8, wherein said shielding layer is configured to reduce, limit or minimize a current induced in said resonator by a corresponding current in said semiconductor substrate.

10. An integrated resonator, comprising:
   a) a first capacitor plate in a first integrated circuit layer;
   b) an inductor in a second integrated circuit layer, over and in electrical communication with said first capacitor plate;
   a second capacitor plate in a third integrated circuit layer, over and in electrical communication with said inductor; and
   a first dielectric layer on or in a semiconductor substrate, said first capacitor plate overlying said first dielectric layer.

11. The integrated resonator of claim 10, wherein said first capacitor plate is configured to shield said integrated resonator from a current in said semiconductor substrate.

12. The integrated resonator of claim 11, wherein said first integrated circuit layer comprises a polysilicon layer.

13. An integrated resonator, comprising:
   a) a first capacitor plate in a first integrated circuit layer;
   b) an inductor in a second integrated circuit layer, over and in electrical communication with said first capacitor plate; and
   a second capacitor plate in a third integrated circuit layer, over and in electrical communication with said inductor;
   wherein said first and second capacitor plates each include a plurality of slots.

14. An integrated resonator comprising:
   a) a first capacitor plate in a first integrated circuit layer;
   b) an inductor in a second integrated circuit layer, over and in electrical communication with said first capacitor plate;
   a second capacitor plate in a third integrated circuit layer, over and in electrical communication with said inductor;
   a semiconductor substrate and a shielding layer between said semiconductor substrate and said first capacitor plate.

15. The integrated resonator of claim 14, further comprising a first shield dielectric layer between said shielding layer and said semiconductor substrate, and a second shield dielectric layer between said shielding layer and said first capacitor plate.

16. The integrated resonator of claim 14, wherein said shielding layer comprises polysilicon.

17. The integrated resonator of claim 14, wherein said shielding layer is coupled to a predetermined voltage or a low impedance node.

18. A method of making an integrated resonator, comprising the steps of:
   constructing an inductor and a capacitor having a first capacitor plate and an opposing second capacitor plate, wherein said inductor and capacitor are constructed by:
   a) forming said first capacitor plate;
   b) forming a first dielectric layer on said first capacitor plate, said first dielectric layer having a first via hole therein;
   c) forming a first via in said first via hole and said inductor on or in said first dielectric layer, wherein said first via couples said first capacitor plate to a front region of said inductor;
   d) forming a second dielectric layer on said inductor, said second dielectric layer having a second via hole therein; and
   e) forming a second via in said second via hole and said second capacitor plate on or in said second dielectric layer, wherein said second via couples said second capacitor plate to an end region of said inductor distant from said front region along the length of said inductor.

19. The method of claim 18, wherein the step of forming said inductor includes forming said inductor in a substantially spiral shape.

20. A method of making an integrated resonator, comprising the steps of:
   a) forming a first capacitor plate;
   b) forming a first dielectric layer on said first capacitor plate, said first dielectric layer having a first via hole therein;
   c) forming a first via in said first via hole and an inductor on or in said first dielectric layer;
   d) forming a second dielectric layer on said inductor, said second dielectric layer having a second via hole therein; and
   e) forming a second via in said second via hole and a second capacitor plate on or in said second dielectric layer;
   wherein the step of forming said first capacitor plate further includes forming a first plurality of slots in said first capacitor plate, and the step of forming said second capacitor plate further includes forming a second plurality of slots in said second capacitor plate.

21. A method of making an integrated resonator, comprising the steps of:
   a) forming a third dielectric layer over a semiconductor substrate; and
   b) forming a shielding layer on or in said third dielectric layer;
   c) forming a first capacitor plate;
   d) forming a first dielectric layer on said first capacitor plate, said first dielectric layer having a first via hole therein;
   e) forming a first via in said first via hole and an inductor on or in said first dielectric layer;
   f) forming a second dielectric layer on said inductor, said second dielectric layer having a second via hole therein; and
   g) forming a second via in said second via hole and a second capacitor plate on or in said second dielectric layer;
   wherein said shielding layer comprises polysilicon.

22. A method of making an integrated resonator, comprising the steps of:
   a) forming a first capacitor plate over a shielding layer;
   b) forming a first dielectric layer on said first capacitor plate, said first dielectric layer having a first via hole therein;
   c) forming a first via in said first via hole and an inductor on or in said first dielectric layer;
   d) forming a second dielectric layer on said inductor, said second dielectric layer having a second via hole therein; and
   e) forming a second via in said second via hole and a second capacitor plate on or in said second dielectric layer;
   wherein said shielding layer comprises polysilicon.

23. A method of shielding a resonator, comprising:
   a) forming a shielding layer over a semiconductor substrate; and
   b) forming said resonator above said shielding layer, said resonator comprising (i) a bottom capacitor plate in a first metal layer, (ii) an inductor in a second metal layer, over and in electrical communication with said bottom capacitor plate, and (iii) a top capacitor plate in a third metal layer, over and in electrical communication with said inductor.

24. A resonator comprising:

a capacitor comprising a first contact plate facing a second contact plate with a dielectric material between the facing first and second contact plates;

an inductor within said dielectric material and positioned between the facing first and second contact plates, said inductor having a first contact node at a front region of said inductor and having a second contact node at an end region of said inductor distant from said front region along a length of said inductor, said first contact node being coupled to said first contact plate and said second contact node being couple to said second contact plate.

* * * * *